(12) United States Patent
Kitani (10) Patent No.: US 10,803,961 B2
(45) Date of Patent: Oct. 13, 2020

(54) POWER SWITCH CONTROL CIRCUIT AND CONTROL METHOD THEREOF

(71) Applicant: Powerchip Semiconductor Manufacturing Corporation, Hsinchu (TW)

(72) Inventor: Tomofumi Kitani, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 31 days.

(21) Appl. No.: 16/294,948

(22) Filed: Mar. 7, 2019

(65) Prior Publication Data

US 2020/0160922 A1 May 21, 2020

(30) Foreign Application Priority Data

Nov. 16, 2018 (JP) .................................. 2018-215792

(51) Int. Cl.
*G11C 16/30* (2006.01)
*G11C 16/32* (2006.01)
(Continued)

(52) U.S. Cl.
CPC ................ *G11C 16/30* (2013.01); *G06F 1/26* (2013.01); *G11C 16/32* (2013.01); *G11C 16/0483* (2013.01)

(58) Field of Classification Search
CPC ..... G11C 16/0483; G11C 16/30; G11C 16/32; G06F 1/26; G06F 1/32
See application file for complete search history.

(56) References Cited

U.S. PATENT DOCUMENTS 9,985,522 B1 * 5/2018 Luft ...................... H02M 3/157
2004/0160330 A1 8/2004 McClure et al.
(Continued)

FOREIGN PATENT DOCUMENTS

EP 0713220 9/2000
EP 2750273 7/2014
(Continued)

OTHER PUBLICATIONS

"Office Action of Taiwan Counterpart Application", dated Apr. 15, 2020, p. 1-p. 4.

*Primary Examiner* — Fahmida Rahman
(74) *Attorney, Agent, or Firm* — JCIPRNET (57) ABSTRACT

A comparator (13) compares a pad voltage with a reference voltage (Vref1) to output a voltage (VCCOK), and a comparator (23) compares a low voltage with a reference voltage (Vref2) to output a voltage (VDDOK). A power-on circuit (2) includes a timer circuit (11) and starts a reference voltage generation circuit (12) after the power switch control circuit is started, and then starts the comparator (13). After the comparator (13) is started, a controller (30) starts a voltage down converter (4) when the voltage (VCCOK) is at the H level, and turns on a MOS transistor (Q1) when the voltage (VCCOK) is at the L level. A power-on circuit (3) includes a timer circuit (21) and starts a reference voltage generation circuit (22) after the voltage down converter (4) is started, and then starts a comparator (23). After the comparator (23) is started, the controller (30) enters the standby state.

4 Claims, 6 Drawing Sheets

(51) Int. Cl.
*G06F 1/26* (2006.01)
*G11C 16/04* (2006.01)

(56) References Cited

U.S. PATENT DOCUMENTS

| | | | |
|---|---|---|---|
| 2012/0161735 A1* | 6/2012 | Sawarkar | H02M 1/36 |
| | | | 323/283 |
| 2018/0034365 A1* | 2/2018 | Sicard | H02M 1/08 |
| 2018/0269787 A1* | 9/2018 | Chen | H02M 3/156 |

FOREIGN PATENT DOCUMENTS

| | | |
|---|---|---|
| JP | 2005050442 | 2/2005 |
| JP | 2006005386 | 1/2006 |
| JP | 2016024561 | 2/2016 |
| TW | 201547174 | 12/2015 |

\* cited by examiner

| Operating mode | DSTBY | VCCOK | Q2 | Q1 | VDC |
|---|---|---|---|---|---|
| 3.3V operating mode | L | H | OFF | OFF | Enable |
| 1.8V operating mode | L | L | OFF | ON | Disable |
| Deep power down mode | H | X | ON | OFF | OFF |

POWER SWITCH CONTROL CIRCUIT AND CONTROL METHOD THEREOF

CROSS-REFERENCE TO RELATED APPLICATION

This application claims the priority benefit of Japan Patent Application No. 2018-215792, filed on Nov. 16, 2018. The entirety of the above-mentioned patent application is hereby incorporated by reference herein and made a part of this specification.

BACKGROUND

Technical Field

The disclosure relates to a power switch control circuit for controlling a power switch such as a semiconductor chip, and a control method thereof.

Description of Related Art

For example, a power management circuit is proposed in Patent Document 1, which is for reducing the power consumption of the whole system of a semiconductor chip. In the power management circuit, a power management IC (PMIC) controls a plurality of power supply circuits that generate power supply voltages for at least the processor. A real-time clock generates a clock of a predetermined frequency. At a power-on terminal PWRON, a power-on key is connected and a voltage is inputted corresponding to the state where the power-on key is pressed. A power-on detection part monitors the voltage at the power-on terminal PWRON and uses the clock generated by the real-time clock to assert a start signal START when the power-on key is pressed continuously for a predetermined time. With the assertion of the start signal START as a trigger, a power management controller sequentially starts a plurality of power supply circuits in a predetermined sequence using the clock.

Figure 1A:
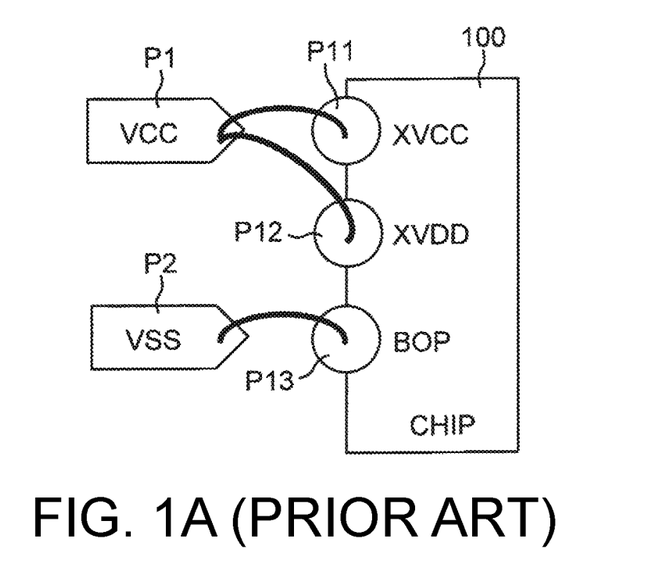
FIG. 1A is a plan view showing a first connection state between the pads and package pads of a semiconductor chip 100, which shows a bonding option method according to a conventional example.
Figure 1B:
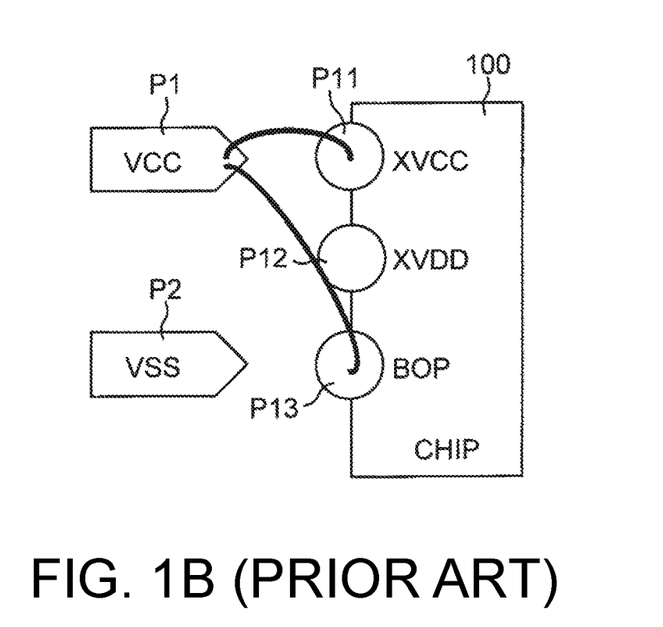
FIG. 1B is a plan view showing a second connection state between the pads and package pads of the semiconductor chip 100, which shows a bonding option method according to the conventional example.

FIG. 1A is a plan view showing a first connection state between the pads and package pads of a semiconductor chip 100, which shows a bonding option method according to a conventional example. FIG. 1B is a plan view showing a second connection state between the pads and package pads of the semiconductor chip 100, which shows a bonding option method according to the conventional example.

Figure 2:
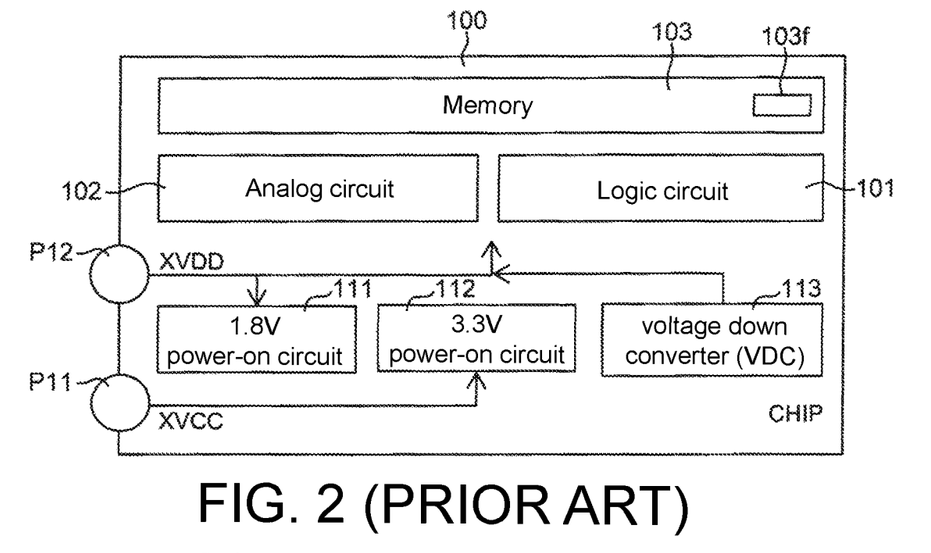
FIG. 2 is a block diagram showing a configuration of the semiconductor chip 100 used in the conventional example.
Figure 3:
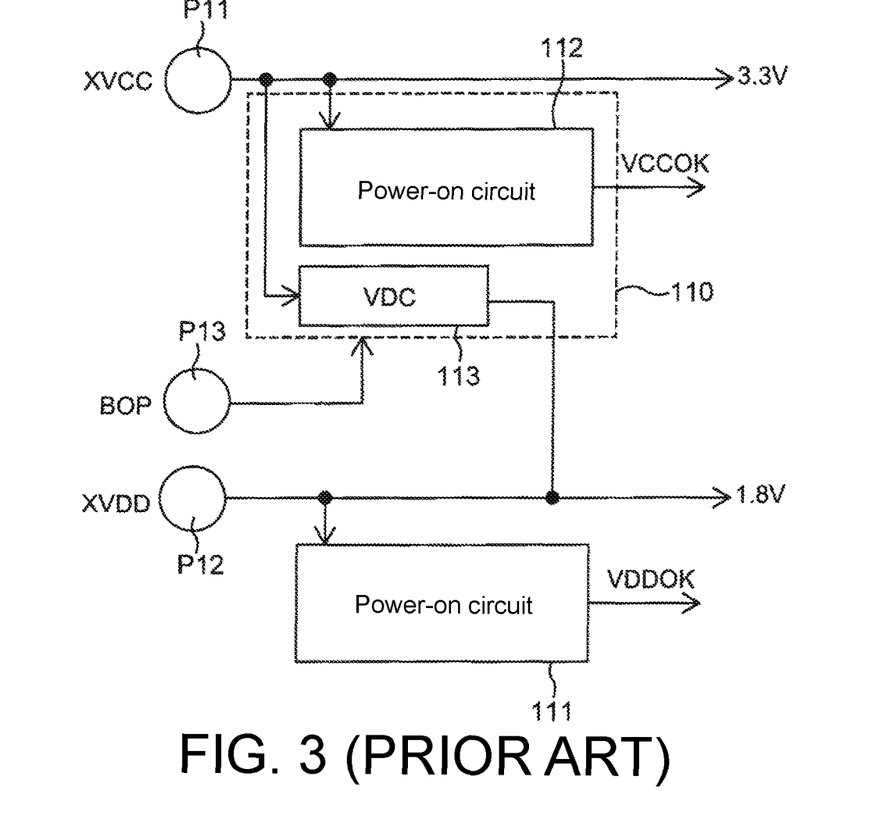
FIG. 3 is a block diagram showing a configuration example of a power switch control circuit used in the semiconductor chip 100 of FIG. 2.

In FIG. 1A and FIG. 1B, the semiconductor chip 100 has the following pads.
(1) Pad P11: a terminal for applying the voltage XVCC
(2) Pad P12: a terminal for applying the voltage XVDD
(3) Pad P13: a terminal for applying the voltage BOP In addition, the package for the semiconductor chip 100 has the following pads.
(1) Pad P1: a terminal of the voltage VCC
(2) Pad P2: a terminal of the voltage VSS FIG. 2 is a block diagram showing a configuration of the semiconductor chip 100 used in the conventional example. FIG. 3 is a block diagram showing a configuration example of a power switch control circuit used in the semiconductor chip 100 of FIG. 2. In FIG. 2 and FIG. 3, the semiconductor chip 100 includes a logic circuit 101, an analog circuit 102, a memory 103 including a fuse circuit 103f that has fuse information, a 1.8V power-on circuit 111, a 3.3V power-on circuit 112, and a voltage down converter (VDC) 113.

Figure 4:
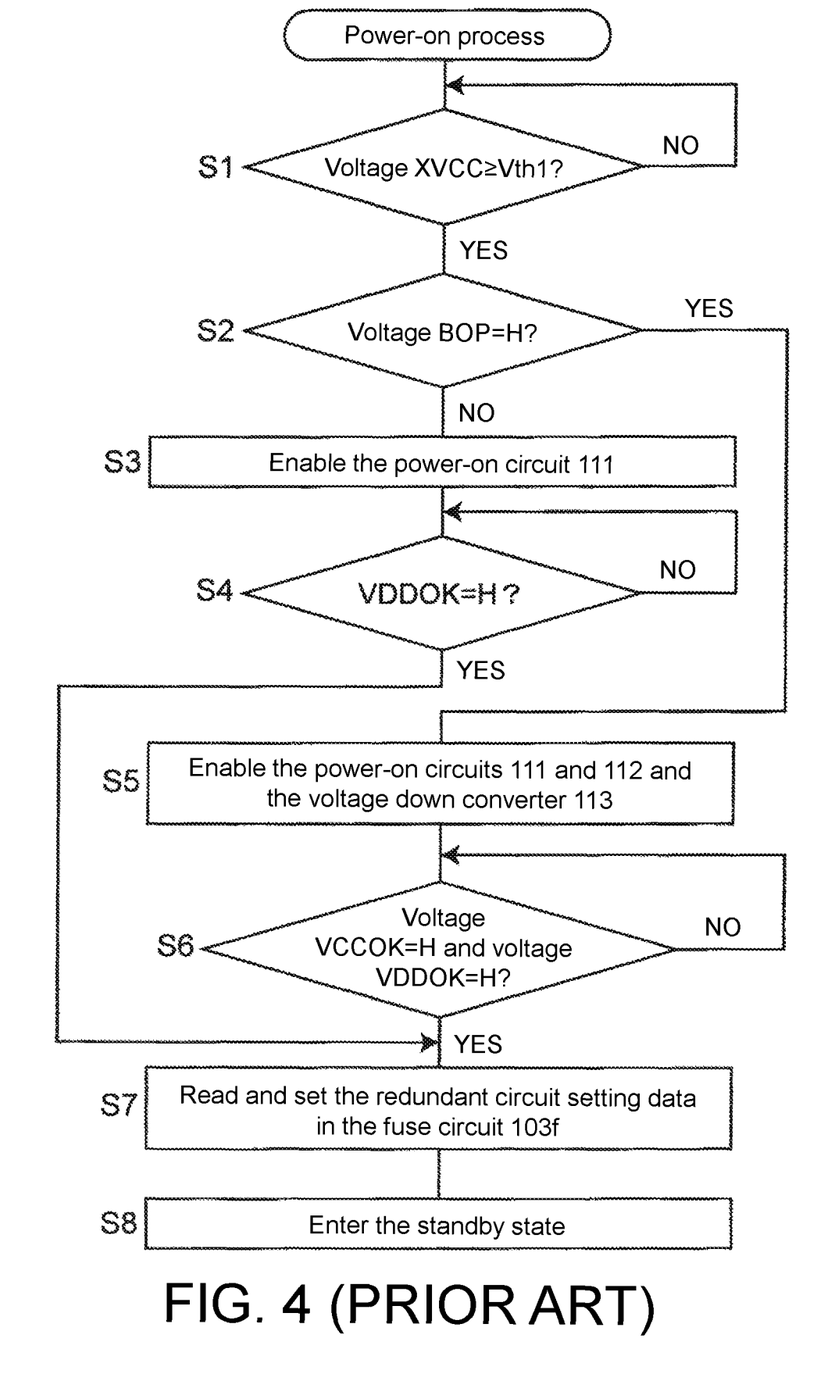
FIG. 4 is a flowchart showing a power-on process executed by the power switch control circuit of FIG. 3.

In the conventional example, in order to combine two types of voltage operating ranges, e.g. 1.8V and 3.3V, and in order to selectively perform a 1.8V device circuit and a 3.3V device circuit on one chip, the voltage operating range is switched as shown in the flowchart of FIG. 4 using the bonding option (BOP) method.

FIG. 4 is a flowchart showing a power-on process executed by the power switch control circuit of FIG. 3.

In step S1 of FIG. 4, whether the voltage XVCC exceeds the predetermined threshold value Vth1 is determined. If the result is YES, whether the voltage BOP is at the H level is determined in step S2. If the result is YES, the process proceeds to step S5. However, if the result is NO, the process proceeds to step S3. In step S3, the power-on circuit 111 is enabled. Then, in step S4, whether the voltage VDDOK is at the H level is determined, and if the result is YES, the process proceeds to step S7. In step S5, the power-on circuits 111 and 112 and the voltage down converter 113 are enabled. Then, in step S6, whether the voltage VCCOK is at the H level and whether the voltage VDDOK is at the H level is determined, and if the result is YES, the process proceeds to step S7. In step S7, the redundant circuit setting data in the fuse circuit 103f is read and set, and the power switch control circuit enters a standby state in step S8.

The semiconductor chip 100 of the conventional example configured as described above includes the 1.8V power-on circuit 111, the 3.3V power-on circuit 112, and the voltage down converter (VDC) 113. When the 1.8V power-on circuit 111 detects the voltage XVDD, the 3.3V power-on circuit 112 and the voltage down converter 113 are disabled during the 1.8V power-on sequence. On the other hand, in the case of the 3.3V operation, the voltage down converter 113 supplies a voltage of 1.8V to the terminal XVDD, and at this time, both the power-on circuits 111 and 112 are enabled.

RELATED ART

Patent Document

[Patent Document 1] Japanese Laid-Open No. 2016-024561

SUMMARY

Problems to be Solved

However, the conventional circuit requires an extra pad region when switching the voltage operating range by using the BOP method. Besides, the device of the semiconductor chip requires two bonding wire arrangements, which is also a problem.

The disclosure provides a power switch control circuit that can switch the voltage operating range with fewer pads than the conventional example, and a control method thereof.

Means for Solving the Problems

According to an embodiment of the disclosure, a power switch control circuit is provided, which includes first and second switches that are connected between a pad voltage and a ground voltage and connected in series with each other, and the power switch control circuit is started by turning on the first switch and turning off the second switch in response to a predetermined command signal. The power switch control circuit includes: a voltage conversion circuit converting the pad voltage to a low voltage less than the pad voltage; first and second reference voltage generation circuits generating reference voltages that are predetermined; a first comparison circuit comparing the pad voltage with a first reference voltage to output a first comparison result signal; a second comparison circuit comparing the low voltage with a second reference voltage to output a second comparison result signal; a control circuit starting the voltage conversion circuit and controlling the first and second switches based on the first and second comparison result signals; and a first power-on circuit including a first timer circuit and starting the first reference voltage generation circuit after the power switch control circuit is started, and then starting the first comparison circuit. After the first comparison circuit is started, the control circuit performs control to start the voltage conversion circuit when the first comparison result signal is at a first level, and turn on the first switch when the first comparison result signal is at a second level. The power switch control circuit further includes: a second power-on circuit including a second timer circuit and starting the second reference voltage generation circuit after the voltage conversion circuit is started, and then starting the second comparison circuit. After the second comparison circuit is started, the control circuit enters a standby state.

Regarding the power switch control circuit, the power switch control circuit is embedded in a semiconductor chip for a non-volatile storage device, and the control circuit reads and sets setting data of a redundant circuit of the non-volatile storage device after the second comparison circuit is started.

According to another embodiment of the disclosure, a control method of a power switch control circuit is provided. The power switch control circuit includes first and second switches that are connected between a pad voltage and a ground voltage and connected in series with each other, and the power switch control circuit is started by turning on the first switch and turning off the second switch in response to a predetermined command signal. The power switch control circuit includes: a voltage conversion circuit converting the pad voltage to a low voltage less than the pad voltage; first and second reference voltage generation circuits generating predetermined reference voltages; a first comparison circuit comparing the pad voltage with a first reference voltage to output a first comparison result signal; a second comparison circuit comparing the low voltage with a second reference voltage to output a second comparison result signal; and a control circuit starting the voltage conversion circuit and controlling the first and second switches based on the first and second comparison result signals. The control method includes: a step in which a first power-on circuit starts the first reference voltage generation circuit after the power switch control circuit is started, and then starts the first comparison circuit; a step in which, after the first comparison circuit is started, the control circuit performs control to start the voltage conversion circuit when the first comparison result signal is at a first level and turn on the first switch when the first comparison result signal is at a second level; a step in which a second power-on circuit starts the second reference voltage generation circuit after the voltage conversion circuit is started, and then starts the second comparison circuit; and a step in which the control circuit enters a standby state after the second comparison circuit is started.

Regarding the control method of the power switch control circuit, the power switch control circuit is embedded in a semiconductor chip for a non-volatile storage device, and the control method includes a step in which the control circuit reads and sets setting data of a redundant circuit of the non-volatile storage device after the second comparison circuit is started.

Effects

Therefore, with the power switch control circuit and the control method thereof according to the disclosure, it is possible to switch the voltage operating range with fewer pads than the conventional example.

DESCRIPTION OF THE EMBODIMENTS

An embodiment of the disclosure will be described below with reference to the drawings where identical or similar components are denoted by the same reference numerals.

Figure 5:
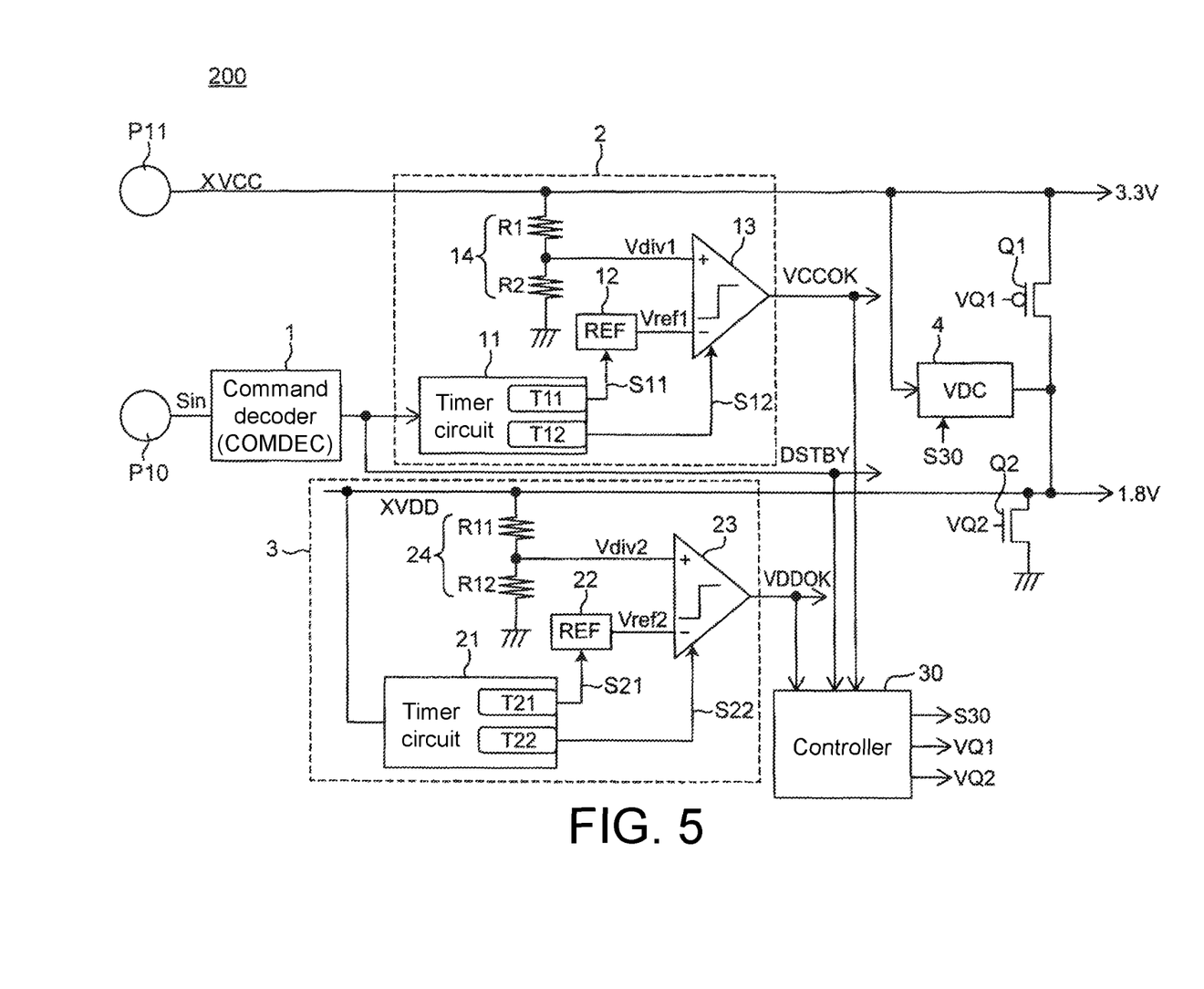
FIG. 5 is a block diagram showing a configuration example of a power switch control circuit of a semiconductor chip 200 according to the embodiment.
Figure 6:
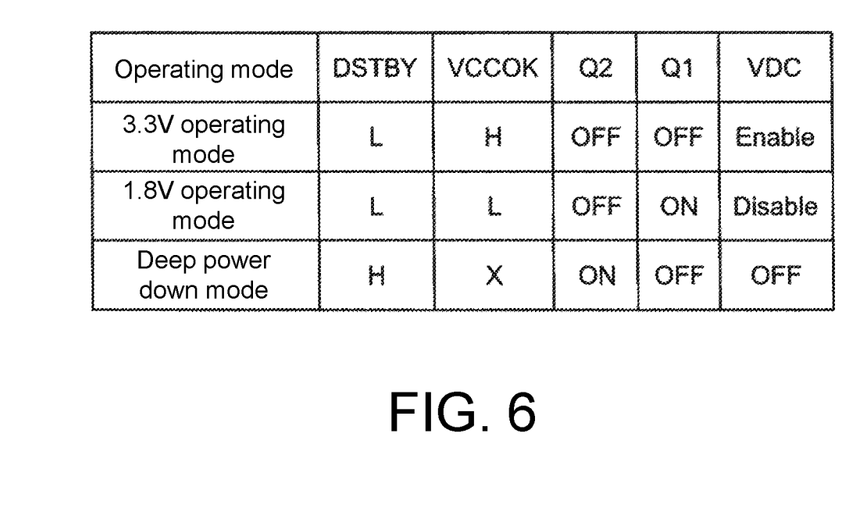
FIG. 6 is a table showing the operating modes of the power switch control circuit of FIG. 5.

FIG. 5 is a block diagram showing a configuration example of a power switch control circuit of a semiconductor chip 200 according to the embodiment. FIG. 6 is a table showing the operating modes of the power switch control circuit of FIG. 5. In FIG. 5, as compared with the power switch control circuit of the conventional example of FIG. 3, the power switch control circuit of the present embodiment is characterized in further including a command decoder 1, a power-on circuits 2 and 3, MOS transistors Q1 and Q2 which are switch circuits, and a controller 30. The power switch control circuit is a control circuit for the semiconductor chip 100, which is a NAND flash memory that is a non-volatile storage device, for example.

In FIG. 5, a power-on circuit 2 includes a timer circuit 11, a reference voltage generation circuit 12, a comparator 13, and a voltage divider circuit 14 including resistors R1 and R2 that are connected in series. A power-on circuit 3 includes a timer circuit 21, a reference voltage generation circuit 22, a comparator 23, and a voltage divider circuit 24 including resistors R11 and R12 that are connected in series.

The voltage XVCC of 3.3V, for example, applied to the pad P11 is directly outputted to the internal circuit and is applied to the source of the MOS transistor Q1. Further, the voltage XVCC is divided by the voltage divider circuit 14 into a predetermined divided voltage Vdiv1 and then applied to the non-inverting input terminal of the comparator 13. The input signal Sin applied to the pad P10 is inputted to the command decoder 1, and the command decoder 1 decodes the inputted command signal Sin and outputs the voltage DSTBY. Here, when the command signal Sin includes a voltage switching signal to 3.3V, for example, the voltage DSTBY is set to the L level and outputted to the timer circuit 11 and the controller 30, so as to start the power switch control circuit. In response to the output voltage DSTBY at the L level, the timer circuit 11 sets the control signal S11 to ON after a predetermined time T11 to enable the reference voltage generation circuit 12. Further, in response to the output voltage DSTBY at the L level, the timer circuit 11 sets the control signal S12 to ON after a predetermined time T12 (>T11) to enable the comparator 13. If the inputted divided voltage Vdiv1 is equal to or greater than the reference voltage Vref1, the comparator 13 outputs the voltage VCCOK at the H level, which is the comparison result signal, to the controller 30. However, if the divided voltage Vdiv1 is less than the reference voltage Vref1, the comparator 13 outputs the voltage VCCOK at the L level, which is the comparison result signal, to the controller 30.

The voltage down converter 4 converts the voltage XVCC of 3.3V to XVDD of 1.8V, which is outputted to the drain of the MOS transistor Q1 of the P channel, the drain of the MOS transistor Q2 of the N channel, and the timer circuit 21. The MOS transistor Q1 and the MOS transistor Q2 are directly connected between the voltage XVCC and the ground voltage. The control voltage VQ1 is applied from the controller 30 to the gate of the MOS transistor Q1 to turn on or off the MOS transistor Q1. The control voltage VQ2 is applied from the controller 30 to the gate of the MOS transistor Q2 to turn on or off the MOS transistor Q2.

In the power-on circuit 3, the voltage XVDD is divided by the voltage divider circuit 24 into a predetermined divided voltage Vdiv2 and then applied to the non-inverting input terminal of the comparator 23. In response to the output voltage XVDD of 1.8V, the timer circuit 21 sets the control signal S21 to ON after a predetermined time T21 to enable the reference voltage generation circuit 22. Further, in response to the output voltage XVDD of 1.8V, the timer circuit 21 sets the control signal S22 to ON after a predetermined time T22 (>T21) to enable the comparator 23. If the inputted divided voltage Vdiv2 is equal to or greater than the reference voltage Vref2, the comparator 23 outputs the voltage VDDOK at the H level, which is the comparison result signal, to the controller 30. However, if the divided voltage Vdiv2 is less than the reference voltage Vref2, the comparator 23 outputs the voltage VDDOK at the L level, which is the comparison result signal, to the controller 30.

Figure 7:
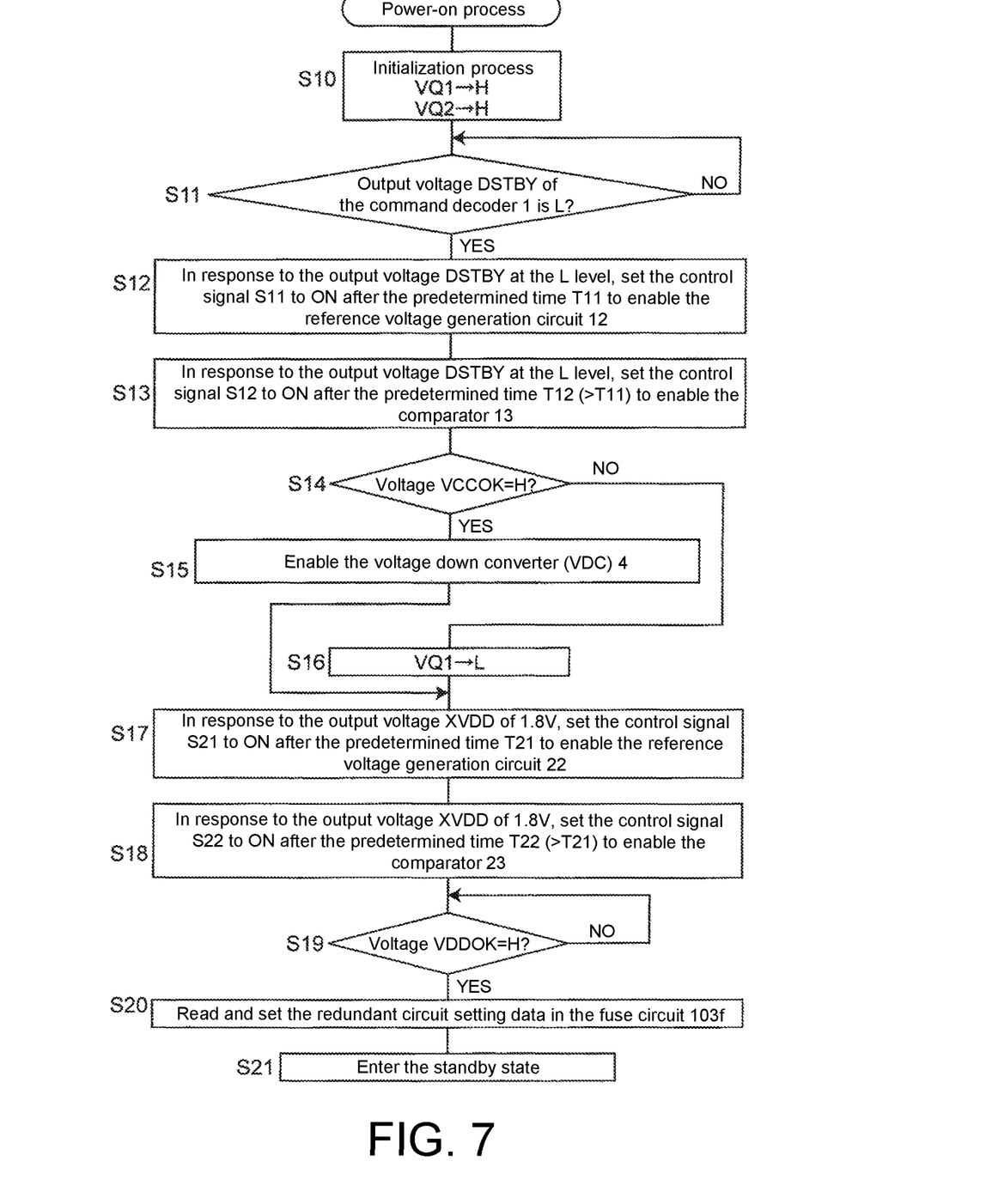
FIG. 7 is a flowchart showing a power-on process executed by the power switch control circuit of FIG. 5.

FIG. 7 is a flowchart showing a power-on process executed by the power switch control circuit of FIG. 5.

In the initialization process in step S10 of FIG. 7, both the voltages VQ1 and VQ2 are set to the H level, the MOS transistor Q1 is turned off, and the MOS transistor Q2 is turned on, so as to set the operating mode to the "deep power down mode" in Table 6. Next, in step S11, whether the output voltage DSTBY of the command decoder 1 is at the L level is determined. If the result is YES, the power switch control circuit is started. In step S12, in response to the output voltage DSTBY at the L level, the control signal S11 is set to ON after the predetermined time T11 to enable the reference voltage generation circuit 12. Further, in response to the output voltage DSTBY at the L level, the control signal S12 is set to ON after the predetermined time T12 (>T11) to enable the comparator 13. In step S12 and step S13, the reference time is determined based on the output voltage DSTBY at the L level, but the disclosure is not limited thereto. The comparator 13 may be enabled when the reference voltage Vref1 reaches a predetermined value after the reference voltage generation circuit 12 is enabled.

Next, in step S14, whether the voltage VCCOK is at the H level is determined. If the result is YES, the process proceeds to step S15. However, if the result is NO, the process proceeds to step S16. In step S15, by enabling the voltage down converter (VDC) 4, the operating mode is set to the 3.3V operating mode in Table 6, and then the process proceeds to step S17.

In step S16, the controller 30 turns off the MOS transistor Q1 by setting the control voltage VQ1 to the L level, and sets the operating mode to the 1.8V operating mode in Table 6, and then the process proceeds to step S17.

In step S17, in response to the output voltage XVDD of 1.8V, for example, the control signal S21 is set to ON after the predetermined time T21 to enable the reference voltage generation circuit 22. Next, in step S18, in response to the output voltage XVDD of 1.8V, for example, the control signal S22 is set to ON after the predetermined time T22 (>T21) to enable the comparator 23, and the process proceeds to step S19. In step S17 and step S18, the reference time is determined based on the output voltage DSTBY at the L level, but the disclosure is not limited thereto. The comparator 23 may be enabled when the reference voltage Vref2 reaches a predetermined value after the reference voltage generation circuit 22 is enabled.

Next, in step S19, whether the voltage VDDOK is at the H level is determined. If the result is YES, the redundant circuit setting data in the fuse circuit 103*f* is read and set in step S20, and the semiconductor chip 200 enters the standby state in step S21.

The power switch control circuit configured as described above is provided with the power-on circuit 2 which includes the timer circuit 11 and starts the reference voltage generation circuit 12 after the power switch control circuit is started, and then starts the comparator 13. After the comparator 13 is started, the controller 30 performs control to start the voltage down converter 4 by outputting control signal S30 to the voltage down converter 4 when the voltage VCCOK is at the H level, and turn on the MOS transistor Q1 when the voltage VCCOK is at the L level. The power switch control circuit is also provided with the power-on circuit 3 which includes the timer circuit 21 and starts the reference voltage generation circuit 22 after the voltage down converter 4 is started, and then starts the comparator 23. After the comparator 23 is started, the controller 30 enters the standby state. Therefore, it is possible to selectively switch to the three operating modes shown in Table 6. According to the power switch control circuit as configured, it is possible to switch the voltage operating range with fewer pads than the conventional example.

FIELD OF INDUSTRIAL APPLICATION

As described in detail above, with the power switch control circuit and the control method thereof according to the disclosure, it is possible to switch the voltage operating range with fewer pads than the conventional example.

What is claimed is:
1. A power switch control circuit, comprising first and second switches that are connected between a pad voltage and a ground voltage and connected in series with each other, wherein the power switch control circuit is started by turning on the first switch and turning off the second switch in response to a predetermined command signal, the power switch control circuit comprising:
 a voltage conversion circuit converting the pad voltage to a low voltage less than the pad voltage;

first and second reference voltage generation circuits generating reference voltages that are predetermined;
a first comparison circuit comparing the pad voltage with a first reference voltage to output a first comparison result signal;
a second comparison circuit comparing the low voltage with a second reference voltage to output a second comparison result signal;
a control circuit starting the voltage conversion circuit and controlling the first and second switches based on the first and second comparison result signals; and
a first power-on circuit comprising a first timer circuit and starting the first reference voltage generation circuit after the power switch control circuit is started, and then starting the first comparison circuit,
wherein after the first comparison circuit is started, the control circuit performs control to start the voltage conversion circuit when the first comparison result signal is at a first level, and turn on the first switch when the first comparison result signal is at a second level, and
the power switch control circuit further comprises:
a second power-on circuit comprising a second timer circuit and starting the second reference voltage generation circuit after the voltage conversion circuit is started, and then starting the second comparison circuit,
wherein after the second comparison circuit is started, the control circuit enters a standby state.

2. The power switch control circuit according to claim 1, wherein the power switch control circuit is embedded in a semiconductor chip for a non-volatile storage device, and
the control circuit reads and sets setting data of a redundant circuit of the non-volatile storage device after the second comparison circuit is started.

3. A control method of a power switch control circuit, which comprises first and second switches that are connected between a pad voltage and a ground voltage and connected in series with each other, wherein the power switch control circuit is started by turning on the first switch and turning off the second switch in response to a predetermined command signal,
wherein the power switch control circuit comprises:
a voltage conversion circuit converting the pad voltage to a low voltage less than the pad voltage;
first and second reference voltage generation circuits generating reference voltages that are predetermined;
a first comparison circuit comparing the pad voltage with a first reference voltage to output a first comparison result signal;
a second comparison circuit comparing the low voltage with a second reference voltage to output a second comparison result signal; and
a control circuit starting the voltage conversion circuit and controlling the first and second switches based on the first and second comparison result signals, and
the control method comprises:
a step in which a first power-on circuit starts the first reference voltage generation circuit after the power switch control circuit is started, and then starts the first comparison circuit;
a step in which, after the first comparison circuit is started, the control circuit performs control to start the voltage conversion circuit when the first comparison result signal is at a first level and turn on the first switch when the first comparison result signal is at a second level;
a step in which a second power-on circuit starts the second reference voltage generation circuit after the voltage conversion circuit is started, and then starts the second comparison circuit; and
a step in which the control circuit enters a standby state after the second comparison circuit is started.

4. The control method of the power switch control circuit according to claim 3, wherein the power switch control circuit is embedded in a semiconductor chip for a non-volatile storage device, and
the control method comprises a step in which the control circuit reads and sets setting data of a redundant circuit of the non-volatile storage device after the second comparison circuit is started.

* * * * *